United States Patent [19]

Chen

[11] Patent Number: 4,799,128

[45] Date of Patent: Jan. 17, 1989

[54] MULTILAYER PRINTED CIRCUIT BOARD WITH DOMAIN PARTITIONING

[75] Inventor: Paul T. H. Chen, St. Paul, Minn.

[73] Assignee: NCR Corporation, Dayton, Ohio

[21] Appl. No.: 42,620

[22] Filed: Apr. 10, 1987

Related U.S. Application Data

[63] Continuation of Ser. No. 811,188, Dec. 20, 1985, abandoned.

[51] Int. Cl.$^4$ .............................................. H05K 1/16
[52] U.S. Cl. .................................... 361/414; 174/68.5
[58] Field of Search ............... 174/68.5; 361/397, 398, 361/400, 403, 405, 406, 408, 409, 412, 414, 416.8; 324/158 P, 158 F, 73 PC, 73 R

[56] References Cited

U.S. PATENT DOCUMENTS

| | | | |
|---|---|---|---|
| 3,395,318 | 7/1968 | Laermer et al. | 361/416 X |
| 3,447,040 | 5/1969 | Denton, Jr. | 361/418 |
| 3,564,115 | 2/1971 | Gribble | 174/68.5 |
| 3,777,129 | 12/1973 | Mehia | 324/73 PC X |
| 3,917,984 | 11/1975 | Kongiet et al. | 174/68.5 X |
| 3,939,381 | 2/1976 | Meany | 174/68.5 X |
| 4,029,999 | 6/1977 | Neumann et al. | 361/400 X |
| 4,030,190 | 6/1977 | Varker | 174/68.5 X |
| 4,063,993 | 12/1977 | Burns | 427/96 X |
| 4,290,015 | 9/1981 | Labriola | 324/73 PC X |
| 4,322,778 | 3/1982 | Barbour et al. | 174/68.5 X |
| 4,411,719 | 10/1983 | Lindberg | 357/70 X |
| 4,434,321 | 2/1984 | Betts | 361/414 X |
| 4,524,239 | 6/1985 | Rouge | 361/414 |
| 4,675,789 | 6/1987 | Kuwabara et al. | 174/68.5 X |

FOREIGN PATENT DOCUMENTS

| | | | |
|---|---|---|---|
| 2211283 | 9/1973 | Fed. Rep. of Germany | 324/158 F |
| 2809841 | 9/1978 | Fed. Rep. of Germany | 361/416 |
| 2305914 | 11/1976 | France | 361/409 |

OTHER PUBLICATIONS

Patrick, R. M., "Flex Strip Transmission Line", IBM Tech. Discl. Bul., vol. 2, No. 6, Apr. 1960, p. 35.

Dougherty, W. E., "Eng. Change Technology Using Off-Set Holes for PCBs", IBM Tech. Discl. Bul., vol. 20, No. 11B, Apr. 1978.

Hubacher, E., "Partially Good Array Packaging Scheme", IBM Tech. Discl. Bul., vol. 24, No. 4, Sep. 1981, pp. 2101–2104.

Primary Examiner—Arthur T. Grimley
Assistant Examiner—D. A. Tone
Attorney, Agent, or Firm—Wilbert Hawk, Jr.; Edward Dugas; Jack R. Penrod

[57] ABSTRACT

A multilayer printed circuit board included a plurality of substrates bonded together in which the surface area of each substrate is divided into equal surface areas in which each area may contain the same number and lengths of lines of conductive elements, monitor holes, plated-through holes and circuit components. Connecting pads mounted within each substrate and intersected by a plated-through hole are positioned adjacent the conductive elements within the substrate and are connected to the elements by connecting segments. The circuit components mounted on a surface of the circuit board have their lead elements connected by bridge members to a monitor hole for testing purposes, said bridge member being severable to isolate the circuit components. A method for manufacturing such a multilayer printed circuit board is likewise disclosed.

5 Claims, 8 Drawing Sheets

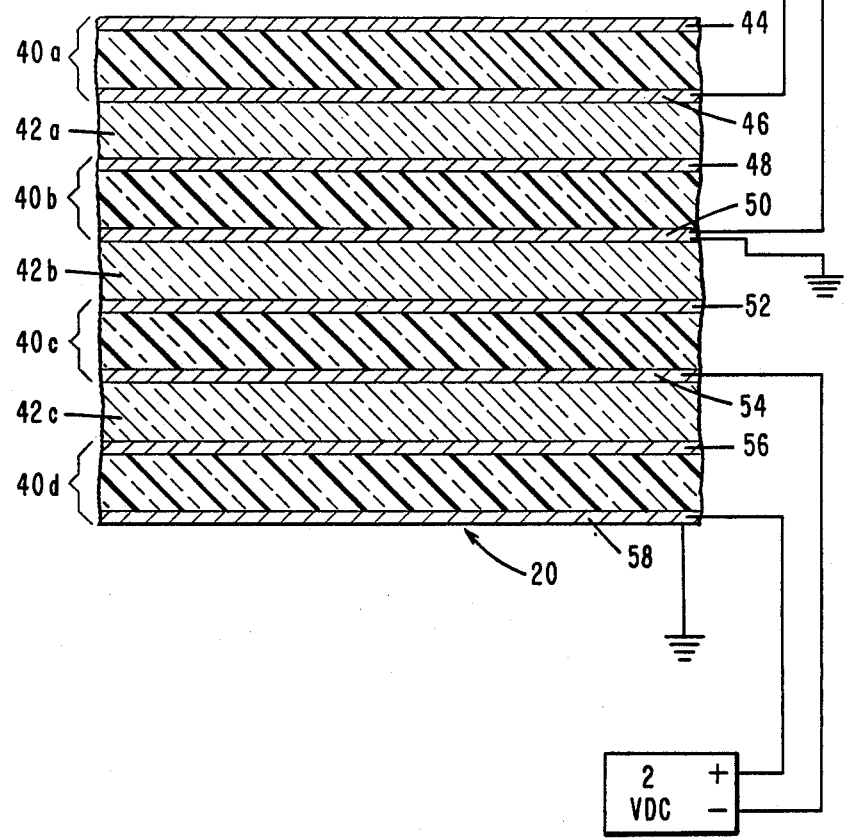

MULTILAYER PRINTED CIRCUIT BOARD WITH DOMAIN PARTITIONING

This is a continuation of Ser. No. 811,188 filed on Dec. 20, 1985.

BACKGROUND OF THE INVENTION

The present invention relates to printed circuit boards and more specifically, to a multilayer printed circuit board and a method for manufacturing such a printed circuit board constructed to increase the number of I.C. packages that can be mounted within a given surface area of the circuit board.

Multilayer printed circuit boards are formed of bounded stacks of cards or substrates of insulated material having tracks or lines of printed conductor elements located on their surfaces, the conductor elements being formed typically by the deposition of a metal such as copper on appropriate areas on the substrate or by etching away unwanted areas of a metal film such as copper which is bonded to the substrate. The card or substrate may be single or double sided, i.e., having lines of conductor elements on one or on both surfaces, respectively, of the card.

Prior printed circuit boards have been designed and manufactured with a different circuit on each card or substrate, the circuits being placed in overlying positions so that points for electrical connections between the circuits are congruent to each other. The individual circuits are then connected by drilling through the assembled cards and plating the holes thus formed with a layer of electrically conductive material such as copper. The leads of the circuit components are then mounted within the holes of the assembled board's exposed planar surface. These leads are then connected with conductor elements on different layers of the board. Each layer of conductor elements may be designed to provide different power supply potentials to the circuit or to be used for signal transmission. Samples of this type of construction may be found in U.S. Pat. Nos. 3,405,227, 3,830,956, 4,281,361, 4,438,560, 4,464,704, and 4,388,136. The layout of the conductor elements found in these patents along with the location of the circuit components vary from circuit board to circuit board. This results in a pattern of conductor elements which produces a high noise factor due to their lengths and their close proximity to a large number of other conductor elements. In addition, since the layout design of a high density circuit board is complex as a result of the intricate patterns of each conductor, together with their interconnecting points, it is a very time consuming and costly procedure to design such layouts.

It is therefore a principal object of this invention to provide a multilayer printed circuit board featuring domain areas or partitions which enable the circuit board to maintain better uniform heat and stress distribution while accommodating a high destiny of circuit components on the outer surface area of the board.

It is another object of this invention to provide a multilayer printed circuit board whose conductor elements are arranged so as to reduce and control the noise level in the circuit.

A further object to this invention is to provide a multilayer printed circuit board whose construction reduces the time for laying out the pattern on the various layers of the board.

A yet further object of this invention is to provide a method for producing a multilayer printed circuit board featuring the same areas or partitions which enable the circuit board to maintain better uniform heat and stress distribution while accommodating a high density of circuit components on the outer surface area of the board.

Another object of this invention is to provide a multilayer printed circuit board whose construction facilitates repair of the circuits without the need of expensive equipment to work into the inner layers of the board.

SUMMARY OF THE INVENTION

These and other objects of this invention are fulfilled by providing a multilayer printed circuit board comprising a plurality of substrates of insulating material bonded together forming the multilayer printed circuit board, each substrate having a surface on which is located a printed circuit comprising a pattern of lines of conductive material, the substrates being bonded in a mutually overlying relation, and each of said substrates being subdivided into equal surface areas in which each surface area has the same number and length of lines of conductive material. A plurality of plated-through holes extend transverse to the substrates and are positioned adjacent the lines of conductive material on the substrates, each of the equal surface areas containing the same maximum number of plated-through holes. A plurality of circuit elements including integrated circuit packages each have lead elements each of which are mounted within a plated-through hole and associated resistors and capacitors mounted to the top surface of the circuit board. Each of said equal surface areas is adapted to contain the same maximum number of integrated circuit packages and the same maximum number of associated resistors and capacitors. A plurality of monitor holes extend through the printed circuit board and are located adjacent the lead elements of the circuit packages, each of the equal surface areas containing the same maximum number of monitor holes. A plurality of metallic bridge elements extend along the top surface of the circuit board connecting each of the lead elements of the integrated circuit package with a monitor hole for testing electrical circuits located within the circuit board, the bridge elements being severable for isolating the electrical circuits located within the circuit board. A plurality of metallic pad members located in the surface of each of the substrates engage the plated-through holes for connecting selected lines of conductive material on a substrate, each of said pad members being formed in a square configuration having rounded corners in which a plated-through hole is located within the boundary of the pad member. A plurality of metallic segments are mounted on the surface of the substrates adjacent the pad members and lines of conductive material, with two of said metallic segments being connected to two adjacent rounded corners of each of the pad members and the same line of conductive material for transmitting signals between the pad members and the conductive material.

In another aspect of the invention there is provided a method of manufacturing multilayer printed circuit boards comprising the steps of laminating a copper layer on both sides of each of a first plurality of dielectric layers; masking and etching a pattern of conductors and connecting pads which is partitioned into a number of equal area domains from each copper layer; sandwiching each of a second plurality of dielectric layers between a respective pair of first plurality of copper laminated layers; assembling the sandwiched layers and the copper laminated layers with each equal area domain in a substantially vertical relationship with a corresponding equal area domains of the other copper laminated layers and bonding all the layers together; drilling a plurality of holes of various depths vertically from a single side of the bonded layers, each hole vertically penetrating through at least one pad; and plating the interior of each of the holes with a conducting material forming a conducting connection to each connecting pad that the respective hole penetrates.

BRIEF DESCRIPTION OF THE DRAWING

Various objects, features and advantages of the invention, as well as the invention itself, will become more apparent to those skilled in the art in light of the following detailed description taken in consideration with the accompanying drawings wherein like reference numerals indicate like or corresponding parts throughout the several views and wherein;

FIG. 4 is an enlarged cross-sectional view of a portion of the printed circuit board of the present invention;

DESCRIPTION OF A PREFERRED EMBODIMENT

Figure 1:
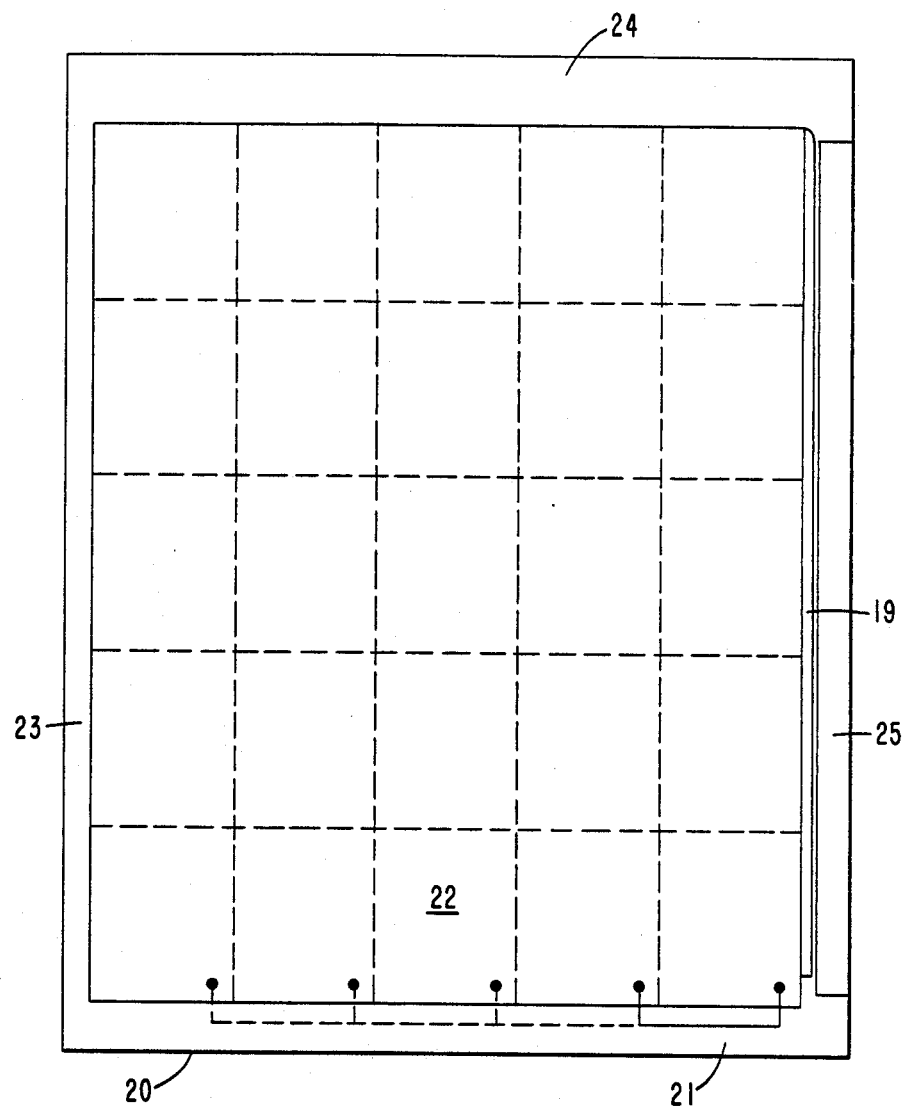
FIG. 1 is a plan view of the top layer of a printed circuit board of the present invention showing the domain area structure.
Figure 2:
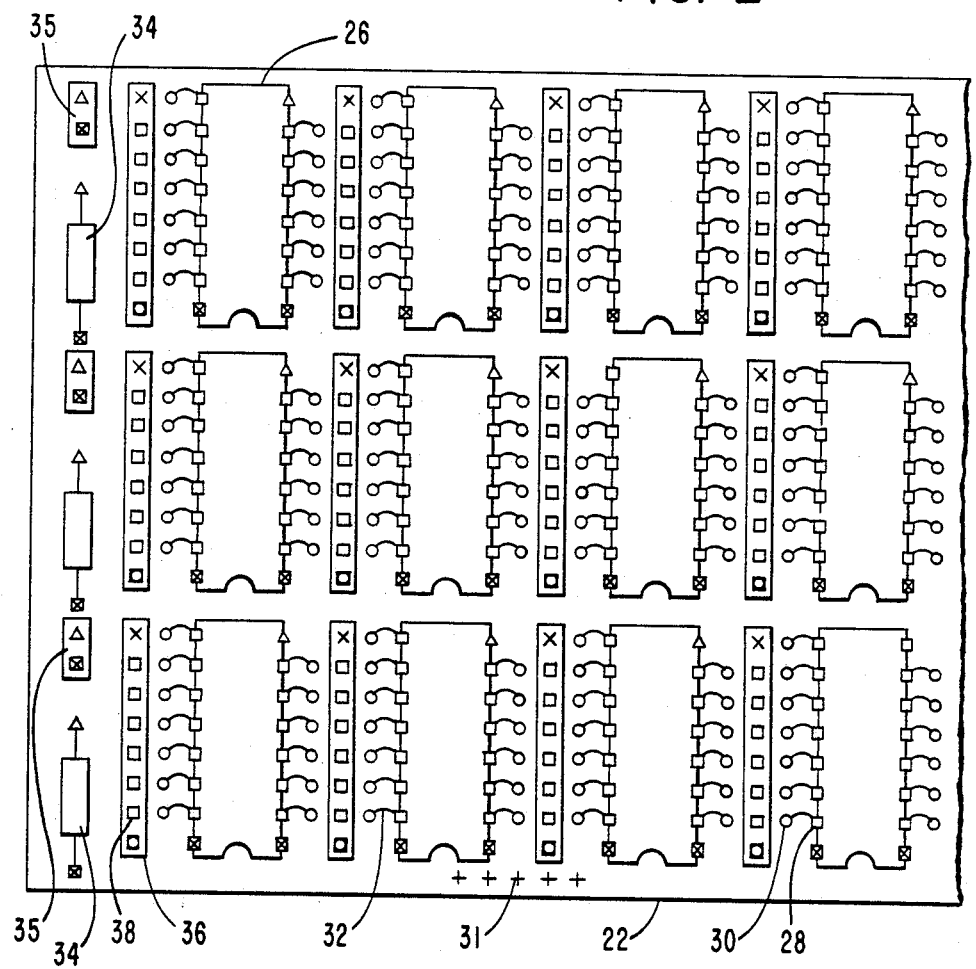
FIG. 2 is an enlarged plan view of a typical domain area of the top layer of a printed circuit board containing DIP I.C. package components.
Figure 3:
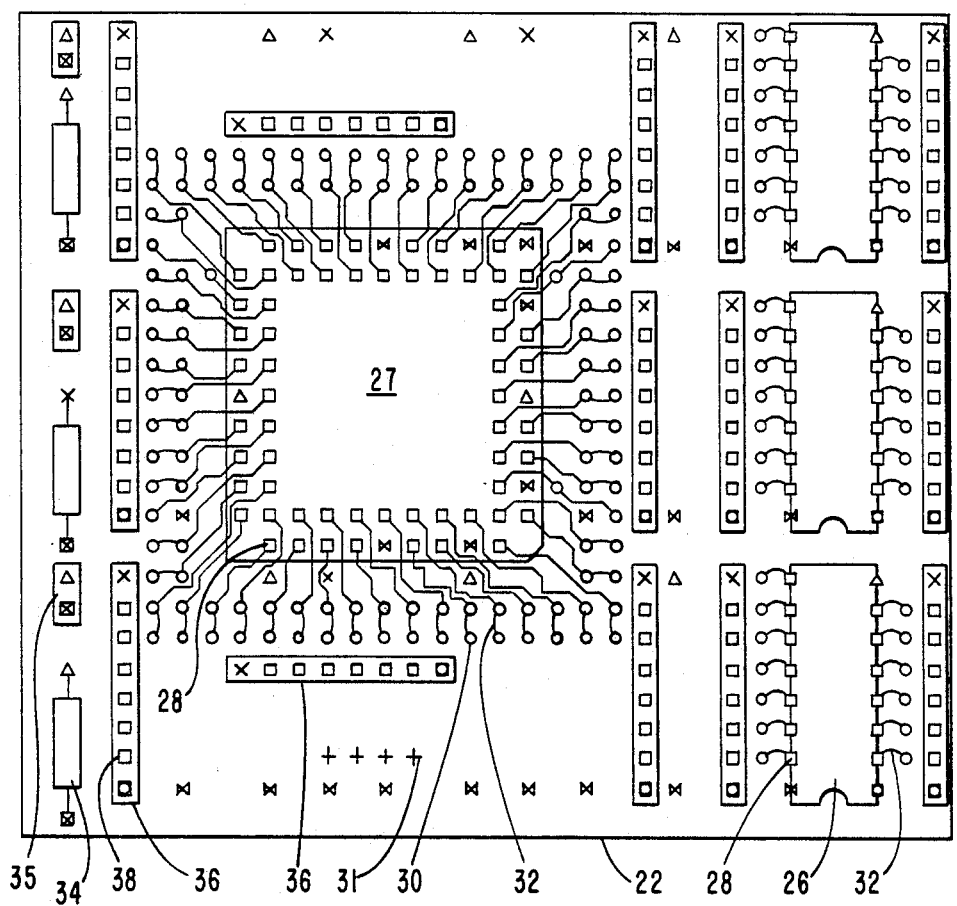
FIG. 3 is an enlarged plan view of a domain area of the top layer of a printed circuit board containing a Macrocell I.C. package component.

Referring to FIG. 1, there is shown a plan view of the top layer of a multilayer printed circuit board 20 constructed in accordance with the present invention. The surface of the top layer of the board 20 is divided into equal surface areas or "domains" 22 in which there may be mounted the same number of I.C. circuit packages. The surface of each of the remaining layers of the circuit board have a similar layout. The area 24 of the circuit board 20, located adjacent the upper edge of the circuit board, may accommodate other circuit components. The area 25 accommodates connecting pins of the board for connecting the board to other printed circuit boards of the same logic deck while the area 23 accommodates connectors for the logic deck cable connection (not shown). The area 21 is designated for test lines (not shown) which are useful in monitoring the quality of the board 20. Buffer gates (not shown) may be located in the area 19 for signal connections to other circuits of the same logic deck. As shown in FIGS. 2 and 3, a domain area 22 may include a predetermine number of I.C. packages 26 such as dual-in-line packages (DIP) or a Macrocell package 27 which is commercially available from Motorola Corp. of Phoenix, Ariz. Each lead element or pin 28 of the DIP packages 26 and the Macrocell package 27 is connected to a monitor point or hole 30 by a 0.1 inch copper bridge element 32. The monitor holes 30 may also be connected to circuit elements such as connecting pads or conductor elements located within the printed circuit board and are used for testing and repairing the circuit elements in a manner that will be explained more fully hereinafter.

Also mounted in the domain area 22 are terminating resistors 36, tantalum capacitors 34 and ceramic capacitors 35. Both capacitors 34 and 35 function to smooth voltage fluctuations on the power conductors. In FIGS. 2 and 3, the symbol Δ represents the location of a minus 5 VDC power source, the symbol X represents a minus 2 VDC power source, the symbol ⊠ represents the ground return for the power sources, the symbol □ represents the location of IC pacage pins 28, the symbol O represent the location of a monitor hole 30, and the symbol + represents the possible location of connecting holes 31 which provide inter-layer connections. Each type of domain area 22 of the circuit board is constructed to have the same number of monitor and connecting holes. Also located on the circuit board within each domain area and adjacent each of the I.C. packages 26 (FIG. 2) and 27 (FIG. 3) is a row of holes 38 for mounting passive components associated with the circuit, such as resistors 36, etc.

Figure 5A:
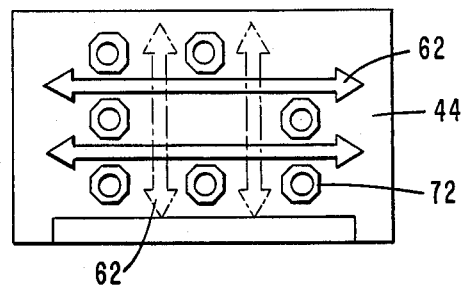
FIGS. 5A–5D, inclusive, are plan views of a portion of various layers of the circuit board showing possible connecting pad arrangement with respect to the lines of conductor elements.
Figure 5B:
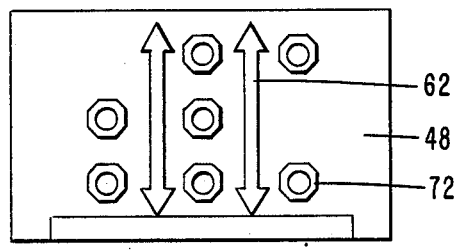
Figure 5C:
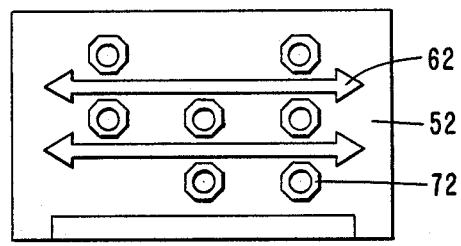
Figure 5D:
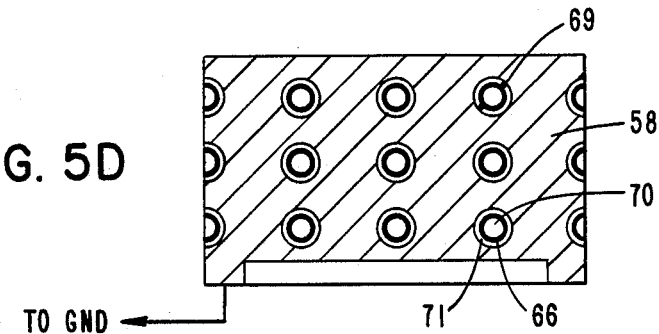

Referring now to FIG. 4, there is shown a cross-sectional view of a portion of the printed circuit board 20 of the present invention which is comprised of four double sided copper layer printed circuit cards 40a–40d, inclusive, laminated together by layers of the dielectric material 42a–42c inclusive. The four circuit cards are constructed of an epoxy-glass material while the laminated layers 42a–42c inclusive are of a similar dielectric material. An etching process well known in the art provides a pattern of lines comprising conductor elements or foils 62 and connecting pads 72 (FIGS. 5A–5C inclusive) in the upper copper layers 44, 48, 52, and 56 (FIG. 4) of cards 40a–40d inclusive. Layers 44, 48, 52 and 56 are designated signal planes over which signals associated with the operation of the circuit are transmitted. The copper layer 46 (FIG. 4) is connected to a minus 5.2 volts D.C. power supply while the layer 54 is connected to a minus 2 volts D.C. power supply. The copper layers 50 and 58 are connected to ground.

Referring now to FIGS. 5A–5D inclusive, there is shown a plan view of a portion of the copper layers 44–58 inclusive. The arrangement of the conductor elements 62, shown in FIGS. 5A–5C inclusive, is intended to maximize the density of the conductor elements in a board using the circuit package 26 (FIG. 2) and the Macrocell package 27 (FIG. 3). The top or utility copper layer 44 (FIG. 5A) may have lines of conductor elements 62 extending in either the X or Y direction but, in any case, the lines may never intersect each other. The conductor elements 62 (FIG. 5B) located in the layers 48 and 56 extend in the Y direction while the conductor elements 62 (FIG. 5C) located in the copper layer 52 extend in the X direction. This uniform arrangement of the conductor elements 62 produces uniform stress and heat dissipation within the board, thus reducing the amount of warpage that may occur. The sandwiching of the power layer 46, 50 and 54 (FIG. 4) between the signal layers 44, 48, 52 and 56 further reduces the noise level. The lower or ground layer 58 (FIG. 5D) includes soldering pads 66 which may be positioned to interconnect plated-through holes 70 with the ground layer 58 through a void or recessed portion 71 (FIG. 8) of the ground layer 58. This connection is made through the use of spoke elements 69 (FIGS. 5D and 8) which bridge the recessed portion 71 to make connection between the pad 66 and the layer 58. The hole 70 may comprise a monitor hole 30 (FIG. 2), a connecting hole 31, or the hole which receives a lead pin from an I.C. package.

Located in certain of the holes 70 are connecting pins 68 (FIG. 8) which are used to interconnect the layers of the printed circuit board by means of connecting pads 72 (FIGS. 5A–5C inclusive) in a manner to be described more fully hereafter. The connecting pin 68 may comprise the pins of I.C. packages 26, 27 (FIGS. 2 and 3) of a separate pin. The pads 72 interconnect pins 68 with any other circuit element and the copper layer in which the pad is located. The inserted pins 68 will be soldered to the board 20 through holes 70 and pad 72. Because the pads 72 and the conductor elements 62 have their designated location in the layer, a pad will never block the way of a conductor element.

Figure 6:
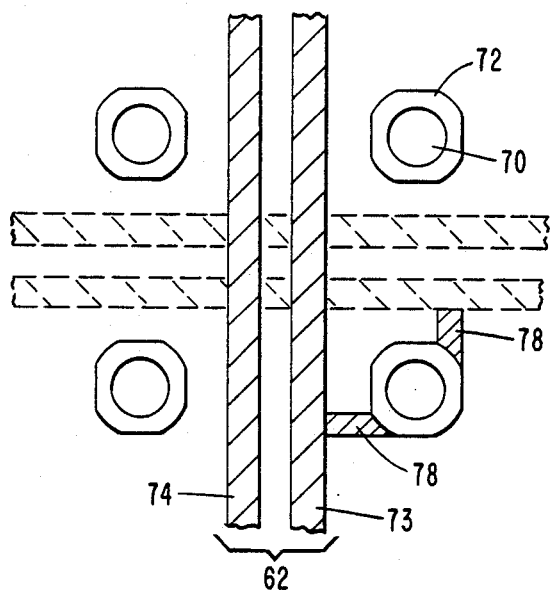
FIG. 6 is a detailed view of a portion of a layer of the printed circuit board of the present invention showing a pad connection to the segments of the conductor elements.
Figure 7:
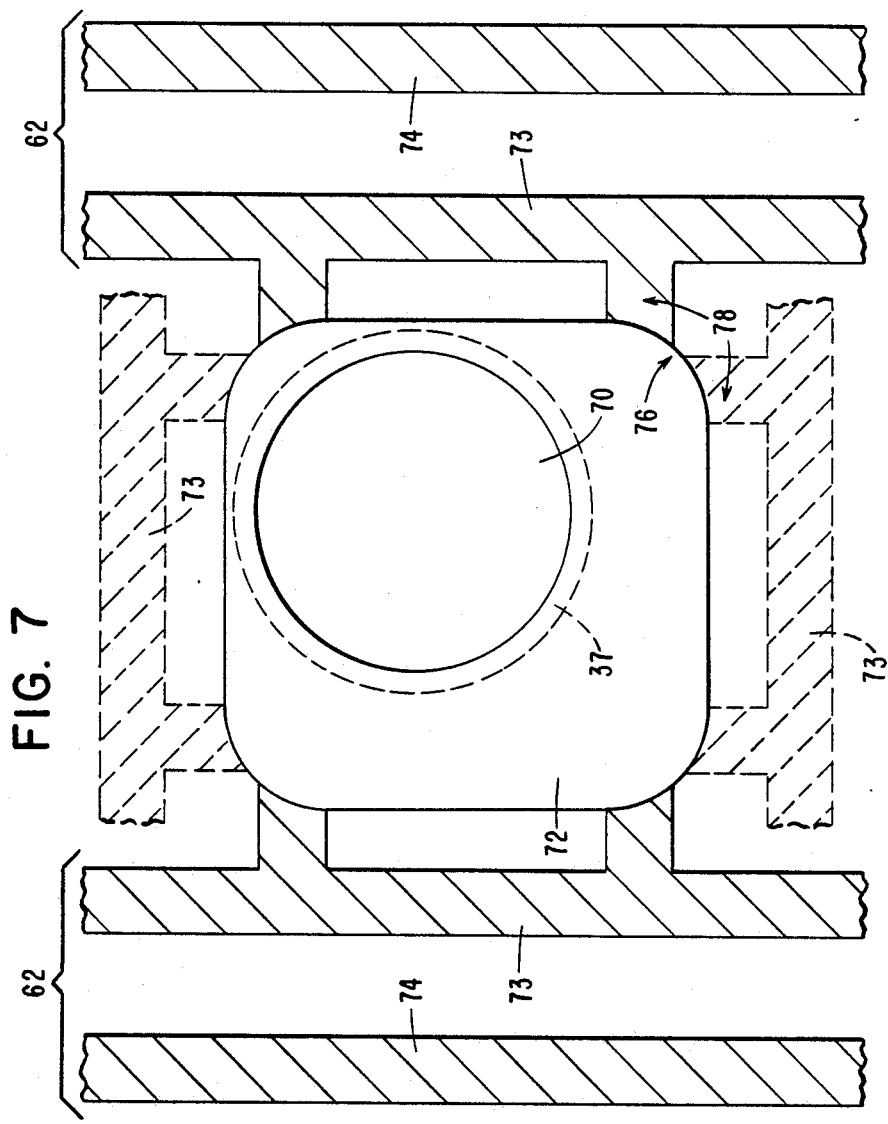
FIG. 7 is an enlarged detailed view of a typical connecting pad showing its connection to the segments of the conductor elements.

Referring now to FIGS. 6 and 7, there is shown details of the connecting pads 72 and the conductor elements 62. As best shown in FIG. 6, each of the conductor elements 62 (FIGS. 5A–5C inclusive) consists of two parallel conductor segments 73, 74 through which electrical signals are transmitted. As shown more clearly in FIG. 7, each connecting pad 72 is formed of copper in a square configuration having curved corner portions 76. The pad 72 is connected at one of its corner portions 76 to one of the conductor segments 73, or 74 by a connecting element 78 composed of the same material as the conductor elements 62, which in the present embodiment is copper. This arrangement allows the required electrical connection to be made between the pad 72 and the segments 73, 74. The splitting of the conductor element 62 into the segments 73 and 74 is made to maintain a constant density of conductor elements in each 0.1 inch space which produces less crosstalk between the conductor elements 62 and provides an easier access to any of the pads 72. The size of a pad 72 (FIG. 7) must be such that it is possible to make connections to the conductor elements 62 under the worst case conditions of artwork and manufacturing tolerances. It has been found that a square pad, being connected to the conductor elements 62 at its curved corner portions, can tolerate larger holes 70 than that of a round pad whose diameter is equal to a side of the square pad. As each side of the pad 72 can accommodate up to two connecting elements 78, a connection to the conductor segments 73 and 74 will remain connected with a pad in the event that one of the corner portions 76 of the pad is broken off during the off center drilling of the hole 70. This double connection arrangement provides a way to select a smaller pad for an extremely dense packaging condition. FIG. 7 shows an off-center drilled hole 70 after it has been plated with a copper layer 37.

Figure 8:
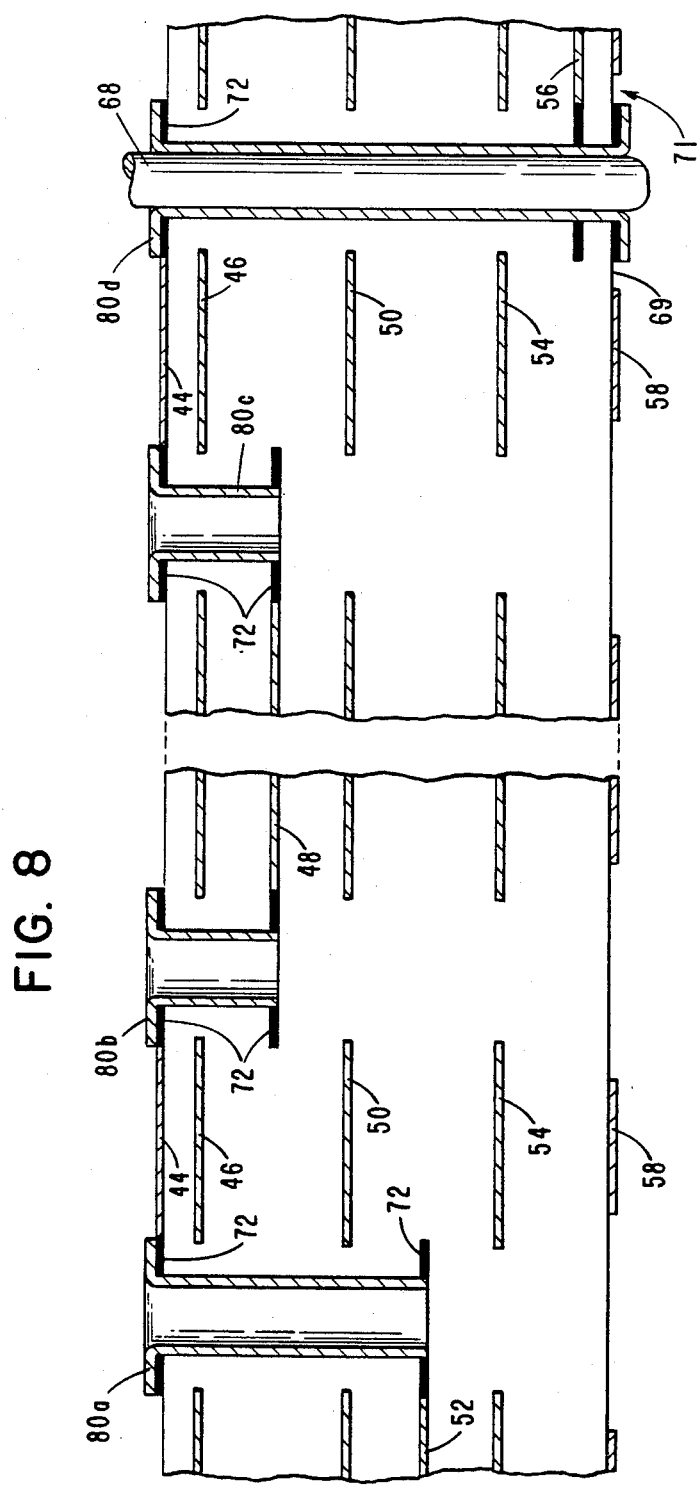
FIG. 8 is a simplified, enlarged cross-sectional view of a portion of the printed circuit board of the present invention.

Referring now to FIG. 8, there is shown a simplified enlarged cross-sectional view of a portion of the printed circuit board 20 which illustrates the signal path extending between two of the copper layers of the circuit board using the connecting pads 72 and the mounting of a connecting pin 68 within a plated-through hole 70. If a signal is to be transmitted from layer 52 to layer 56, the signal is transmitted from layer 52 through the plated-through hole 80a, the layer 44, the plated-through holes 80b, the layer 48, the plated-through hole 80c, layer 44 and the plated-through hole 80d to layer 56. Thus, a signal path is completed using the connecting pads 72 and the plated-through holes 80a–80d inclusive.

In fabricating the circuit board 20, each of the glass-epoxy cards 40a–40d inclusive (FIG. 4) is first prepared by laminating a copper layer to both sides of the card. The pattern of lines of conductor elements 62, 64 (FIGS. 5A–5C) inclusive and the required connecting pads 72 on each side of the cards 40a–40d inclusive are then made by the application of a mask and etching process to the copper layer in a manner that is well known in the art. After the cards 40a–40d inclusive have been prepared in this manner, they are assembled in the proper order by the sandwiching of the laminated glass-epoxy layers 42a–42c inclusive between the cards. Once the circuit board is formed, the required holes 70 (FIG. 7) are then drilled through the circuit board at a depth (FIG. 8) which intersects the selected connecting pads 72 to provide the required connections between the circuit elements and the conductor elements in the layer. The holes 70 are then plated with a copper layer 37 (FIG. 7) in a manner that is well known in the art, after which the required connecting pins 68 (FIG. 8), which may be a separate pin or comprise the lead pins of the circuit elements 34, 26 etc., are then inserted in the appropriate holes 70 in the board. It will be seen that the fabrication of a circuit board having the construction as just described reduces the occurrence of mistakes since the method is always the same.

If, after the printed circuit board has been assembled, a circuit defect is found within the layers of the board, a repair can be made by cutting the appropriate bridge element 32 (FIG. 2) which extends between a lead pin 68 of a circuit element and a monitor hole 30 connected to the defective circuit element. This operation isolates the defective circuit element allowing tests to be made using the monitor hole 30 to determine the nature of the defect. It is obvious that the bridge element 72 can be repaired if the cause of the defect condition has been corrected.

While the principles of the invention have now been made clear in an illustrated embodiment, it will be obvious to those skilled in the art that many modifications and variations of the present invention are possible in light of the above teachings. The appended claims are therefore intended to cover and embrace any such modifications, within the limits only of the true spirit and scope of the invention.

I claim:

1. A multilayer printed circuit board comprising:
    a plurality of substrates of insulating material bonded together forming the multilayer printed circuit board, each substrate having a surface on which is located a printed circuit comprising a pattern of lines of conductive material, said substrates being bonded in a mutually overlying relation, and each of said substrates being subdivided into equal surface areas in which each surface area has the same number and length of lines of conductive material;
    a plurality of plated-through holes extending transverse to the substrates and positioned adjacent the lines of conductive material on said substrates, each of said equal surface areas containing at most a same predetermined number of plated-through holes;

a plurality of circuit elements including integrated circuit packages each having lead elements each of which is mounted within a plated-through hole and associated passive components mounted to the top surface of the circuit board, each of said equal surface areas is adapted to receive at most a same predetermined number of integrated circuit packages and at most a same predetermined number of associated passive components;

a plurality of monitor holes extending through the printed circuit board and located adjacent the lead elements of the circuit packages, each of said equal surface areas containing at most a same number of monitor holes;

a plurality of metallic bridge elements extending along the top surface of the circuit board connecting each of the lead elements of the integrated circuit package with a monitor hole for testing electrical circuits located within the circuit board, said bridge elements being severable for isolating the electrical circuits located within the circuit board;

a plurality of metallic pad members located in the surface of each of said substrates engaging said plated-through holes for connecting selected lines of conductive material on a substrate, each of said pad members being formed in a square configuration having rounded corners in which a plated-through hole is located within the boundary of the pad member; and a plurality of metallic segments mounted on the surface of said substrates adjacent said pad members and lines of conductive material, two of said metallic segments being connected to two adjacent rounded corners of each of said pad members and the same line of conductive material for transmitting signals between the pad members and the conductive material.

2. A multilayer printed circuit board according to claim 1, wherein each of said equal surface areas dissipates substantially the same amount of heat as any other of said equal surface areas whereby warpage of the multilayered printed circuit board due to thermal differences is prevented.

3. A multilayer printed circuit board comprising:

a first layer of copper having a surface which is partitioned into a plurality of domains;

each domain has the same surface dimensions as the other domains;

a first layer of dielectric located beneath said first layer of copper;

each domain is masked and etched to have a pattern of conductors for connecting up to a predetermined number of components for each domain;

a second layer of copper bonded to a side of said first layer of dielectric opposite to said first layer of copper, masked and etched to have a pattern of conductors and connection pads for a supply of voltage from a first power supply;

a second layer of dielectric material bonded beneath said second layer of copper;

a third layer of copper bonded beneath said second layer of dielectric, masked and etched to have a pattern of conductors and connection pads running in a first direction for transmission of a first number of electrical signals;

a third layer of dielectric bonded beneath a third layer of copper;

a fourth layer of copper bonded beneath said third layer of dielectric, masked and etched to have a pattern of conductors and connection pads for connection to a first circuit ground;

a fourth layer of dielectric bonded beneath said fourth layer of copper;

a fifth layer of copper bonded beneath said fourth dielectric layer, masked and etched to have a pattern of conductors and connection pads running in a second direction perpendicular to said first direction for transmission of a second number of electrical signals;

a fifth layer of dielectric bonded beneath said fifth layer of copper;

a sixth layer of copper bonded beneath said fifth layer of dielectric, masked and etched to have a pattern of conductors and connection pads for a supply of voltage of a second power supply;

a sixth layer of dielectric bonded beneath said sixth layer of copper;

a seventh layer of copper bonded beneath said sixth layer of dielectric, masked and etched to have a pattern of conductors and connection pads running in said first direction for transmitting a third number of electrical signals;

a seventh layer of dielectric bonded beneath said seventh layer of copper;

an eighth layer of copper bonded beneath said seventh layer of dielectric, masked and etched to have a rectangular pattern of holes in said eighth layer of copper, each for locating a respective plated-through hole conductor;

said eighth layer of copper for conducting signals and supplying current to ground; and at least one spoke element connecting a plated through hole to ground at said eighth layer of copper.

4. A multilayer printed circuit board according to claim 3, wherein:

one of said domains is adapted for mounting at most twelve dual inline packages on said first layer of copper; and at least one other of said domains is adapted for mounting a macrocell and three dual inline packages on said first layer of copper.

5. A multilayer printed circuit board according to claim 4, wherein, the number of conductors in each layer of copper vertically beneath each domain is substantially the same.

* * * * *